(12) United States Patent
Marcus

(10) Patent No.: US 8,853,637 B2
(45) Date of Patent: Oct. 7, 2014

(54) PARTICLE BASED NEUTRON DETECTOR

(75) Inventor: Matthew S. Marcus, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 211 days.

(21) Appl. No.: 13/308,170

(22) Filed: Nov. 30, 2011

(65) Prior Publication Data

US 2013/0134315 A1    May 30, 2013

(51) Int. Cl.
    *G01T 3/08*    (2006.01)

(52) U.S. Cl.
    USPC .................................................. 250/370.05

(58) Field of Classification Search
    USPC .................................................. 250/370.05
    See application file for complete search history.

(56) References Cited

U.S. PATENT DOCUMENTS

| | | |
|---|---|---|
| 5,334,840 A | 8/1994 | Newacheck et al. |
| 5,659,177 A | 8/1997 | Schulte et al. |
| 6,770,020 B2 | 8/2004 | De Stasio et al. |
| 7,183,701 B2 | 2/2007 | Downing et al. |
| 7,439,519 B2 | 10/2008 | Feller |
| 7,542,301 B1 * | 6/2009 | Liong et al. .................. 361/761 |
| 7,619,226 B2 | 11/2009 | Beinhocker |
| 7,857,993 B2 | 12/2010 | Dai et al. |
| 7,990,032 B2 | 8/2011 | Downing et al. |
| 2010/0327171 A1 * | 12/2010 | Robinson et al. ........ 250/370.05 |
| 2011/0006206 A1 | 1/2011 | Downing et al. |
| 2011/0017916 A1 * | 1/2011 | Schulz et al. ................. 250/368 |
| 2011/0133092 A1 * | 6/2011 | Hansen et al. ................ 250/366 |
| 2011/0163242 A1 | 7/2011 | Mao et al. |
| 2011/0204244 A1 * | 8/2011 | Haard et al. .................. 250/369 |
| 2013/0009262 A1 * | 1/2013 | Dowben et al. ............... 257/428 |

* cited by examiner

*Primary Examiner* — David Porta
*Assistant Examiner* — Hugh H Maupin
(74) *Attorney, Agent, or Firm* — Schwegman Lundberg & Woessner, P.A.

(57) ABSTRACT

A method and device include a conductive base layer, a semiconducting layer supported by and electrically coupled to the base layer, the semiconductor layer have integrated gadolinium nanoparticles presenting a high cross section to neutron particles, and a conductive top layer electrically coupled to the semiconductor layer, wherein the base layer and top layer are disposed to collect current from electrons resulting from neutron interactions with the gadolinium nanoparticles.

19 Claims, 4 Drawing Sheets

PARTICLE BASED NEUTRON DETECTOR

BACKGROUND

Neutrons can be detected to indicate the presence of some nuclear materials, such as plutonium, and can also be used in nuclear medicine. Some prior neutron detectors utilized a gadolinium film disposed between two conductors. Electrons are generated from interactions with neutrons, resulting in conducting electrons within the film. However, not much current was generated in the conductors, making it difficult to determine the number of interactions that occurred.

SUMMARY

A device includes a conductive base layer, a semiconducting layer supported by and electrically coupled to the base layer, the semiconductor layer have integrated gadolinium nanoparticles presenting a high cross section to neutron particles, and a conductive top layer electrically coupled to the semiconductor layer, wherein the base layer and top layer are disposed to collect current from electrons resulting from neutron interactions with the gadolinium nanoparticles.

In a further embodiment, a method includes forming a conductive base layer, adding a semiconductor layer having integrated gadolinium nanoparticles presenting a high cross section to neutron particles, and forming a conductive top layer electrically coupled to the semiconductor layer, wherein the base layer and top layer are disposed to collect current from electrons resulting from neutron interactions with the gadolinium nanoparticles.

In a further embodiment, a device includes a conductive base layer, multiple conductive semiconductor layers supported by the base layer, the semiconductor layers have integrated gadolinium nanoparticles presenting a high cross section to neutron particles and wherein each semiconductor layer is separated by an intermediate conductive layer, and a conductive top layer electrically coupled to the last of the multiple semiconductor layers, wherein the base layer, intermediate layers, and top layer are electrically coupled in parallel to generate current from electrons resulting from neutron collisions with the gadolinium nanoparticles.

BRIEF DESCRIPTION OF THE DRAWINGS

FIG. 4A is an illustration of a particle interacting with a neutron and providing light as a result of the interaction according to an example embodiment.

FIG. 4B is a side view of a neutron detector having a neutron conversion film and light detector according to an example embodiment.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software or a combination of software and human implemented procedures in one embodiment. The software may consist of computer executable instructions stored on computer readable media such as memory or other type of storage devices. Further, such functions correspond to modules, which are software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system.

Various embodiments use sub-micron gadolinium-based materials such a gadolinium oxide ($Gd_2O_3$) to detect neutrons. Gadolinium nanoparticles are integrated into a semiconducting device to improve detection efficiency. Gadolinium oxide can be formed by thermal decomposition of the hydroxide, nitrate, carbonate, or oxalates. Several methods are known for the synthesis of gadolinium oxide nanoparticles, mostly based on precipitation of the hydroxide by the reaction of gadolinium ions with hydroxide, followed by thermal dehydration to the oxide. The nanoparticles may be coated with a protective material to avoid the formation of larger polycrystalline aggregates.

Figure 1A:
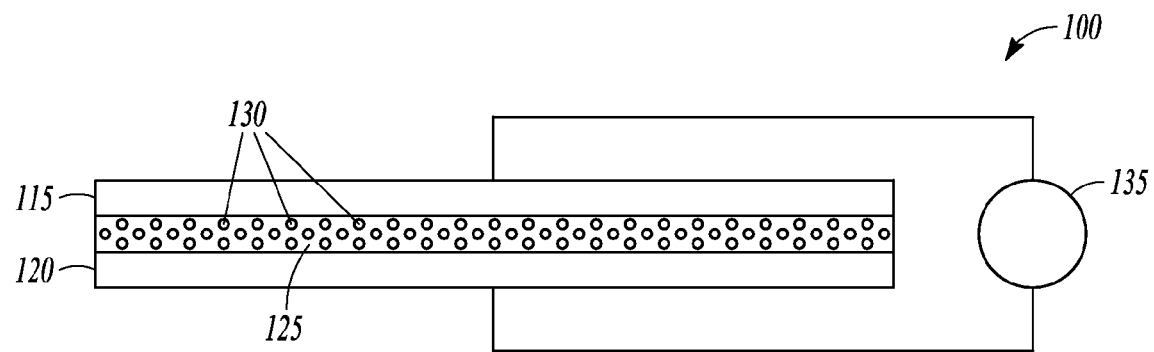
FIG. 1A is block side elevation view of a neutron detection device according to an example embodiment.

An example semiconducting device is show in side elevation view at 100 in FIG. 1A. The device may be formed by standard semiconducting processes, such as printing. In one embodiment, the device uses an organic semiconducting material or a nano-material base 125. Electrodes 115, 120 are respectively supported by the base material 125, which in one embodiment is a layer of semiconducting material 125 and a neutron sensitive material 130, such as gadolinium.

Figure 1B:
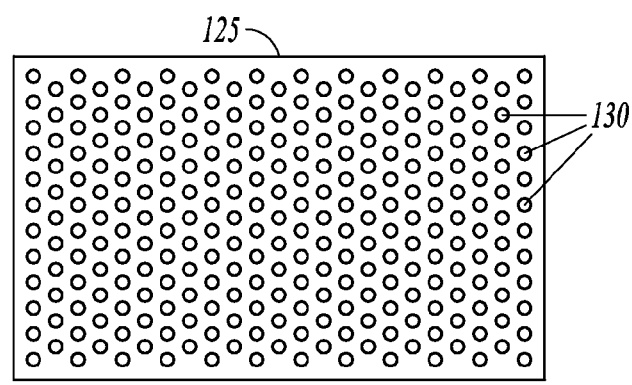
FIG. 1B is a top view of a neutron detection device neutron detecting nanoparticle infused semiconductor layer according to an example embodiment.

Device 100 functions by converting neutrons into an electrical signal by means of the neutron sensitive material including nanoparticles 130. In one embodiment, the neutron sensitive material 130 includes gadolinium, which offers an enormous neutron capture cross section that can be as large as 1e5 greater than traditional materials. Among other interactions, gadolinium is able to convert captured neutrons into high energy electrons and x-rays via an internal conversion process as well as subsequent Auger interactions. The resultant high energy photons and electrons are absorbed by the nearby semiconducting material and create low energy electrons and holes that are extracted as a measureable current by electrodes 115 and 120 which are in turn electrically coupled to a detector 135. A top view of the semiconductor layer 125 in FIG. 1B illustrates many example nanoparticles 130 integrated into the semiconductor 125. In one embodiment, the nanoparticles 130 generally have a size of between 10 and 100 nanometers in diameter or smaller. The semiconductor 125 may be formed of silicon, and some common materials include PbSe, PbS, or simply Si, and may be doped or undoped.

In one embodiment, the base 125 may also be the same layer as one of the electrodes 115 or 120, and serves as a flexible substrate that may be formed of metal. By making the base flexible, the device may be formed using roll to roll manufacturing processes, providing the ability to mass produce the device in a variety of sizes. Device 100 is massively scalable in one embodiment. A slurry material that includes the semiconductor layer 125 with nanoparticles 130 mixed in is then printed on one of the electrodes, which serves as a flexible medium for the printing. A solvent may be used with the slurry material to aid in obtaining a desired consistency of the slurry to form the semiconductor layer 125. Following forming of the semiconductor layer 125, a top metal layer is added to form the other electrode. The resulting material may be cut to a desired shape or size and utilized as a neutron detector.

In one embodiment, a method includes forming a conductive base layer that is flexible. A semiconductor layer having integrated gadolinium nanoparticles presenting a high cross section to neutron particles is then added to the base layer. A conductive top layer is formed on top of the semiconductor layer and is electrically coupled to the semiconductor layer. The base layer and top layer are disposed to generate current from electrons resulting from neutron collisions with the gadolinium nanoparticles.

In one embodiment, the conductive base layer is moved while adding the semiconductor layer and forming the conductive top layer in a roll-to-roll process. The semiconductor layer may be added as a silicon (Si) containing slurry. The slurry may include a solvent to provide a desired consistency, and following adding the slurry, the solvent evaporates to effectively cure the slurry into the semiconductor layer having integrated gadolinium nanoparticles. The semiconductor layer in one embodiment has a thickness adapted to facilitate capture of the resulting electrons by the base and top layers. For example, the thickness of the semiconductor layer is less than or equal to a path length of resulting electrons in one embodiment. While the thickness may be quite a bit larger than the path length, it may be less efficient at converting neutrons to electrical current, as the electrons may not reach a conductor.

In various embodiments, at least some of the gadolinium nanoparticles 130 have a diameter less than 100 nanometers or less than 10 nanometers.

The nanoscale size of gadolinium particles provides for efficient extraction of short range electrons before they are reabsorbed, thus allowing them to reach the electrodes as a measurable current. As indicated above, the size of the nanoparticles may be varied, with smaller particles generally being more desirable. The particles need not be uniformly the same size. The density of the particles integrated into the semiconductor layer 125 should be high enough to extract the resulting created electron hole pairs into the electrodes. Similarly, the thickness of the layer in some embodiments may be adjusted as a function of the path length of electrons such that the electrodes capture the electrons before they recombine with holes.

Figure 2:
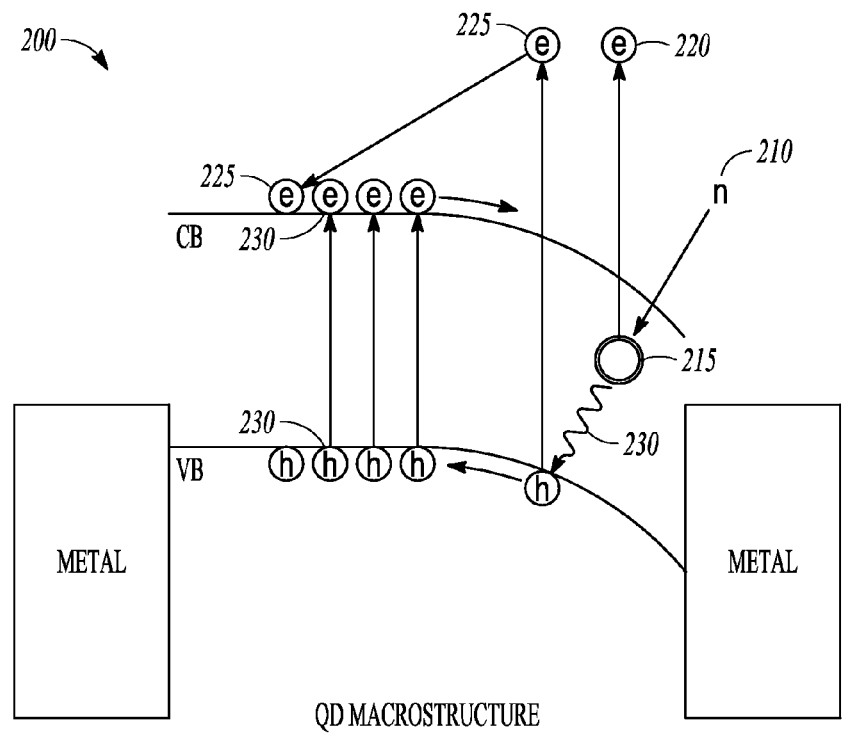
FIG. 2 is a block diagram illustrating the interaction of neutrons with the device of FIGS. 1A and 1B according to an example embodiment.

FIG. 2 is a block diagram illustrating the interaction of neutrons with the device generally at 200. The device includes electrodes 115 and 120 disposed about the semiconductor, which is not illustrated so that the following particle interactions are more clearly illustrated. A neutron 210 is shown colliding or interaction with a nanoparticle 215 of gadolinium. This results in the creation of Auger electrons 220, and x-rays 230 at relatively high energies. These high energy particles create electron hole pairs throughout the semiconductor which are subsequently measured as a current at the electrode level.

In one embodiment, interaction of one neutron with the layer 125 can result in the generation of between 15,000 and 30,000 electrons. These interactions may be measured as pulses of current representative of the number of such interactions. Connecting several layers in parallel so that their currents add, can be done to obtain higher measurement currents and greater neutron capture efficiency. In such cases, the current may be integrated and processed to calculate the numbers of neutrons interacting with the device.

With the use of thin semiconductor layer with gadolinium nanoparticles, the interactions between neutrons and particles are more likely to result in a pulse of current being detectible with a smaller amount of gadolinium than in prior devices. The thin semiconductor layer provides a suitable conduction path to allow extraction of electron-hole pairs to create the current in the electrodes. The detector 135 may be used to count the number of current pulses corresponding to the neutrons, and also may sum the current pulses over selected periods of time to derive a count of the number of interactions per unit of time. In an additional embodiment, the detector 135 provides a single pulse integration feature to better discriminate between spurious background pulses and those occurring as a result of a neutron-gadolinium interaction.

Figure 3:
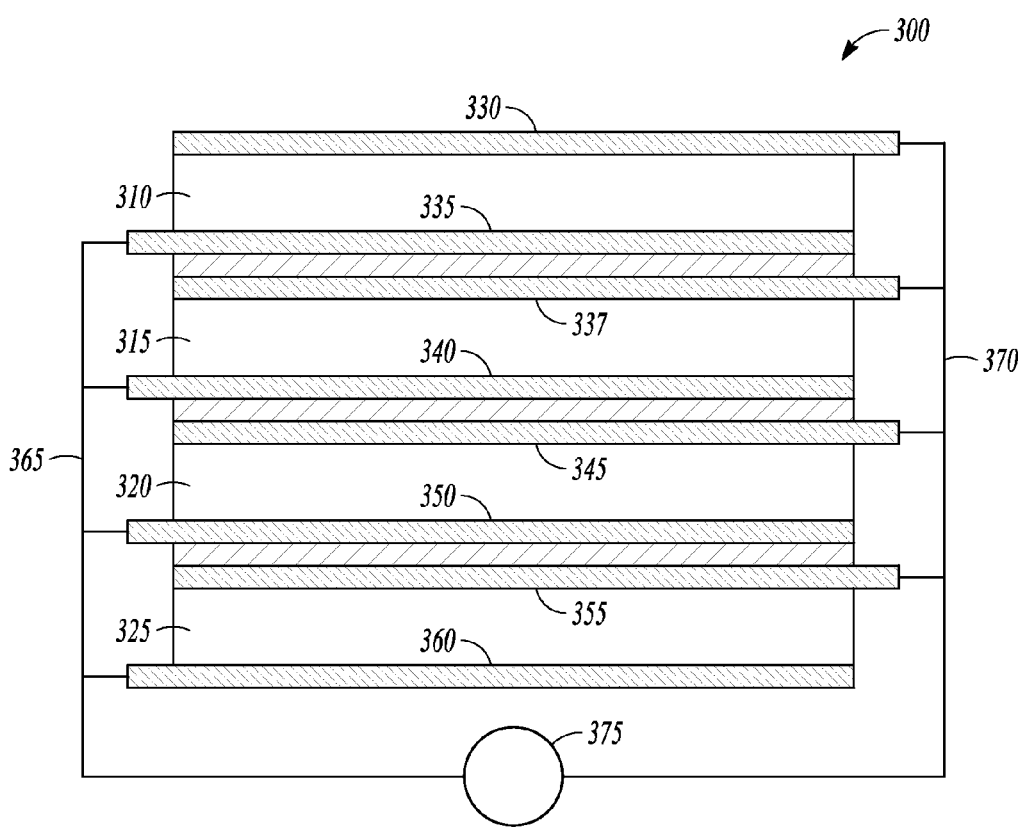
FIG. 3 is a block side elevation view of a neutron detection device having multiple nanoparticle infused semiconductor layers according to an example embodiment.

FIG. 3 illustrates a multiple level neutron detection device 300. Device 300 is formed with four semiconductor detection layers 310, 315, 320, and 325, each having neutron detecting nanoparticles. Each of the layers is sandwiched between electrodes indicated at 330, 335, 337, 340, 345, 350, 355, and 360. The electrodes in one embodiment may be coupled in parallel to sum the current resulting from generated electrons in each layer, as indicated by conductors 365 and 370.

Thus, device 300 includes a conductive base layer 330, multiple conductive semiconductor layers 310, 315, 320, and 325 supported by the base layer 330, wherein the semiconductor layers have integrated gadolinium nanoparticles presenting a high cross section to neutron particles. Each semiconductor layer is separated by an intermediate pairs of insulation separated conductive layers 335 and 337, 340 and 345, 350 and 355. Layer 360 is a conductive top layer that is electrically coupled to the last layer 325 of the multiple semiconductor layers. The base layer 330, intermediate conductive layers, and top layer 350 are electrically coupled in parallel to generate current from electrons resulting from neutron collisions with the gadolinium nanoparticles. The current is run through a load 375 for measurement.

In one embodiment, at least some of the semiconductor layers have a thickness adapted to facilitate capture of the resulting electrons by the base and top layers. In a further embodiment, the semiconductor layers comprise silicon.

Figure 4C:
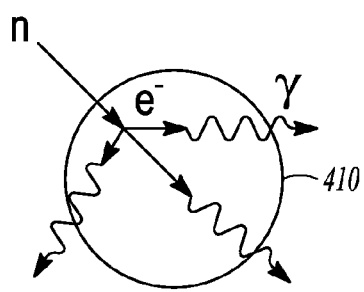
FIG. 4C is a side view of an array of detectors of FIG. 4B.
Figure 4C:
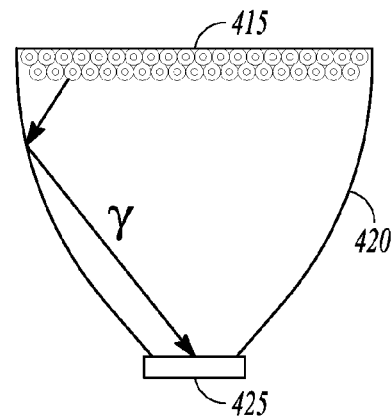
Figure 4C:
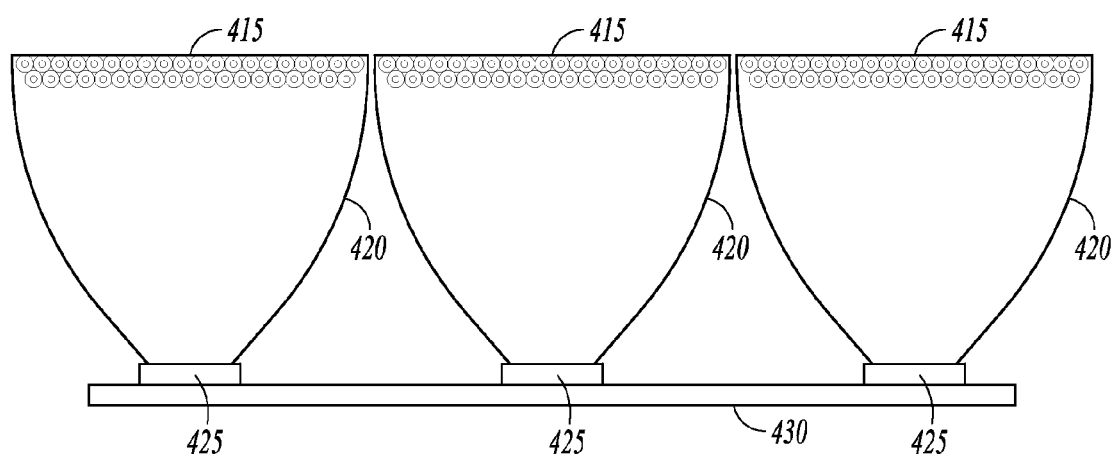

An alternative neutron detector is illustrated in FIGS. 4A, 4B, and 4C. In FIG. 4A, a $Gd_2O_3$, nanoparticle 410 is illustrated as a neutron interacts with it. The collision results in an electron and photons being generated.

In FIG. 4B, a neutron conversion film 415 containing $Gd_2O_3$ nanoparticles is formed over a photon concentrating structure 420, which directs photons emitted from the collision toward at photodetector 425. As illustrated in FIG. 4C, several such structures including the film 415, concentrating structure 420 and photodetector 425 may be supported in an array like structure by a support member 430 to form an array of neutron pixels. The support member 430 may contain suitable conductors for providing the output of each pixel to a computer system for imaging applications.

Figure 5:
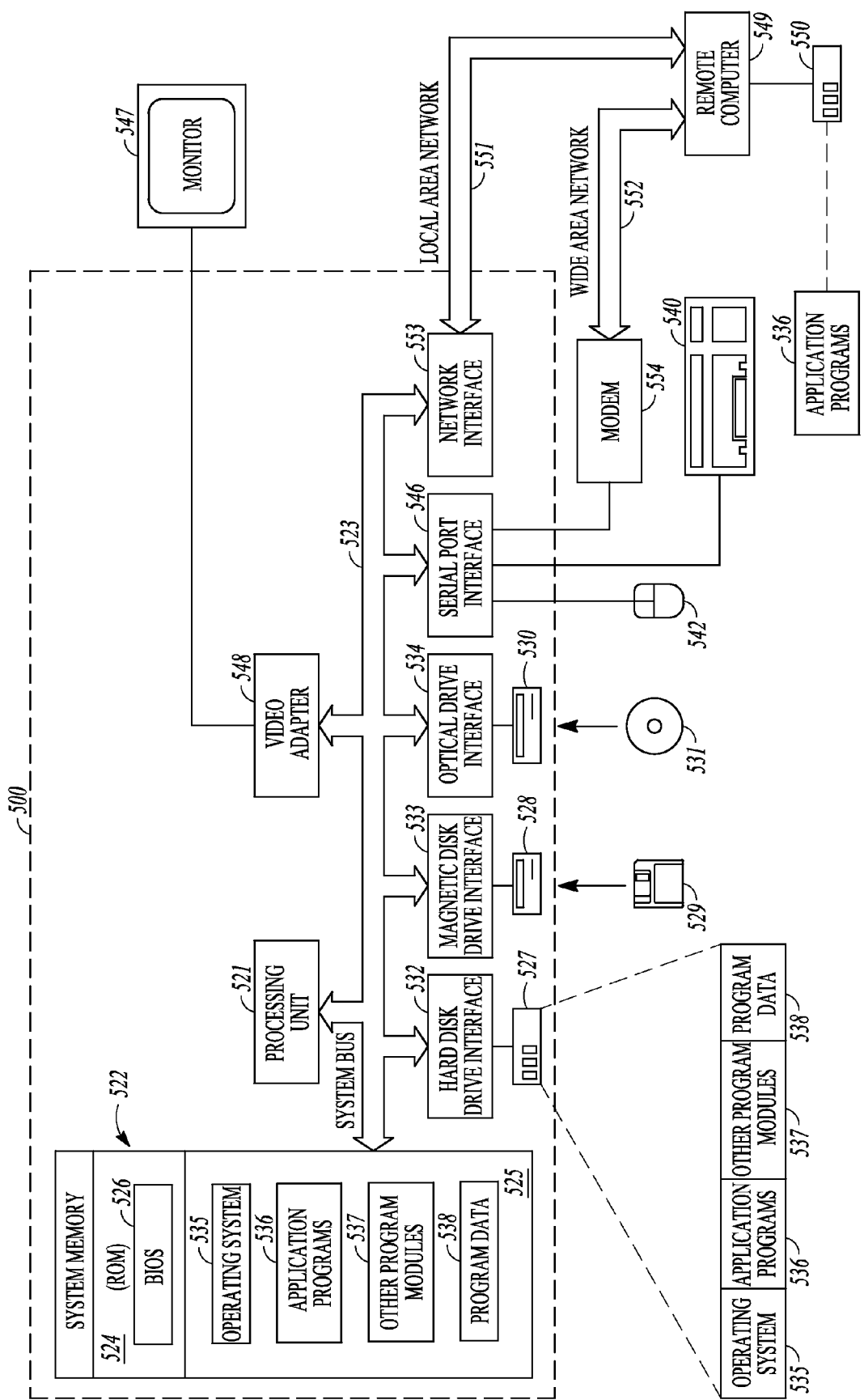
FIG. 5 is a block diagram of a computer system to implement counting or integrating of neutron interactions and providing a platform for detection applications by receiving data from arrays of neutron detecting pixels according to an example embodiment.

FIG. 5 is a block diagram of a computer system to implement the counting or integrating of neutron interactions and providing a platform for detection applications by receiving data from arrays of neutron detecting pixels according to an example embodiment. In the embodiment shown in FIG. 5, a hardware and operating environment is provided that is applicable to any of the servers and/or remote clients shown in the other Figures.

As shown in FIG. 5, one embodiment of the hardware and operating environment includes a general purpose computing device in the form of a computer 500 (e.g., a personal computer, workstation, or server), including one or more processing units 521, a system memory 522, and a system bus 523 that operatively couples various system components including the system memory 522 to the processing unit 521. There may be only one or there may be more than one processing unit 521, such that the processor of computer 500 comprises a single central-processing unit (CPU), or a plurality of processing units, commonly referred to as a multiprocessor or parallel-processor environment. In various embodiments, computer 500 is a conventional computer, a distributed computer, or any other type of computer.

The system bus 523 can be any of several types of bus structures including a memory bus or memory controller, a peripheral bus, and a local bus using any of a variety of bus architectures. The system memory can also be referred to as simply the memory, and, in some embodiments, includes read-only memory (ROM) 524 and random-access memory (RAM) 525. A basic input/output system (BIOS) program 526, containing the basic routines that help to transfer information between elements within the computer 500, such as during start-up, may be stored in ROM 524. The computer 500 further includes a hard disk drive 527 for reading from and writing to a hard disk, not shown, a magnetic disk drive 528 for reading from or writing to a removable magnetic disk 529, and an optical disk drive 530 for reading from or writing to a removable optical disk 531 such as a CD ROM or other optical media.

The hard disk drive 527, magnetic disk drive 528, and optical disk drive 530 couple with a hard disk drive interface 532, a magnetic disk drive interface 533, and an optical disk drive interface 534, respectively. The drives and their associated computer-readable media provide non volatile storage of computer-readable instructions, data structures, program modules and other data for the computer 500. It should be appreciated by those skilled in the art that any type of computer-readable media which can store data that is accessible by a computer, such as magnetic cassettes, flash memory cards, digital video disks, Bernoulli cartridges, random access memories (RAMs), read only memories (ROMs), redundant arrays of independent disks (e.g., RAID storage devices) and the like, can be used in the exemplary operating environment.

A plurality of program modules can be stored on the hard disk, magnetic disk 529, optical disk 531, ROM 524, or RAM 525, including an operating system 535, one or more application programs 536, other program modules 537, and program data 538. Programming for implementing one or more processes or method described herein may be resident on any one or number of these computer-readable media.

A user may enter commands and information into computer 500 through input devices such as a keyboard 540 and pointing device 542. Other input devices (not shown) can include a microphone, joystick, game pad, satellite dish, scanner, or the like. These other input devices are often connected to the processing unit 521 through a serial port interface 546 that is coupled to the system bus 523, but can be connected by other interfaces, such as a parallel port, game port, or a universal serial bus (USB). A monitor 547 or other type of display device can also be connected to the system bus 523 via an interface, such as a video adapter 548. The monitor 547 can display a graphical user interface for the user. In addition to the monitor 547, computers typically include other peripheral output devices (not shown), such as speakers and printers.

The computer 500 may operate in a networked environment using logical connections to one or more remote computers or servers, such as remote computer 549. These logical connections are achieved by a communication device coupled to or a part of the computer 500; the invention is not limited to a particular type of communications device. The remote computer 549 can be another computer, a server, a router, a network PC, a client, a peer device or other common network node, and typically includes many or all of the elements described above I/O relative to the computer 500, although only a memory storage device 550 has been illustrated. The logical connections depicted in FIG. 5 include a local area network (LAN) 551 and/or a wide area network (WAN) 552. Such networking environments are commonplace in office networks, enterprise-wide computer networks, intranets and the internet, which are all types of networks.

When used in a LAN-networking environment, the computer 500 is connected to the LAN 551 through a network interface or adapter 553, which is one type of communications device. In some embodiments, when used in a WAN-networking environment, the computer 500 typically includes a modem 554 (another type of communications device) or any other type of communications device, e.g., a wireless transceiver, for establishing communications over the wide-area network 552, such as the internet. The modem 554, which may be internal or external, is connected to the system bus 523 via the serial port interface 546. In a networked environment, program modules depicted relative to the computer 500 can be stored in the remote memory storage device 550 of remote computer, or server 549. It is appreciated that the network connections shown are exemplary and other means of, and communications devices for, establishing a communications link between the computers may be used including hybrid fiber-coax connections, T1-T3 lines, DSL's, OC-3 and/or OC-12, TCP/IP, microwave, wireless application protocol, and any other electronic media through any suitable switches, routers, outlets and power lines, as the same are known and understood by one of ordinary skill in the art.

EXAMPLES

1. A device comprising:
   a conductive base layer;
   a conductive semiconductor layer supported by and electrically coupled to the base layer, the semiconductor layer have integrated gadolinium nanoparticles presenting a high cross section to neutron particles; and
   a conductive top layer electrically coupled to the semiconductor layer, wherein the base layer and top layer are disposed to generate current from electrons resulting from neutron interactions with the gadolinium nanoparticles.

2. The device of example 1 wherein the semiconductor layer has a thickness adapted to facilitate capture of the resulting electrons by the base and top layers.

3. The device of example 2 wherein the thickness of the semiconductor layer is less than or equal to a path length of resulting electrons.

4. The device of example 1 and further comprising gadolinium nanoparticles having a diameter less than 100 nanometers.

5. The device of example 1 and further comprising gadolinium nanoparticles having a diameter less than 10 nanometers.

6. The device of example 1 and further comprising gadolinium nanoparticles having a diameter of between approximately 100 nanometer and 10 nanometers.

7. The device of example 1 wherein the semiconductor layer comprises silicon.

8. The device of example 1 wherein the semiconductor layer comprises conductively doped silicon.

9. The device of example 1 wherein the semiconductor layer comprises at least one of PbSe and PbS.

10. A method comprising:
forming a conductive base layer;
adding a semiconductor layer having integrated gadolinium nanoparticles presenting a high cross section to neutron particles; and
forming a conductive top layer electrically coupled to the semiconductor layer, wherein the base layer and top layer are disposed to generate current from electrons resulting from neutron interactions with the gadolinium nanoparticles.

11. The method of example 10 and further comprising moving the conductive base layer while adding the semiconductor layer and forming the conductive top layer in a roll-to-roll process.

12. The method of example 11 wherein the semiconductor layer is added as a Si containing slurry.

13. The method of example 12 wherein the slurry comprises a solvent.

14. The method of example 10 wherein the semiconductor layer has a thickness adapted to facilitate capture of the resulting electrons by the base and top layers.

15. The method of example 14 wherein the thickness of the semiconductor layer is less than or equal to a path length of resulting electrons.

16. The method of example 10 wherein at least some of the gadolinium nanoparticles have a diameter less than 100 nanometers.

17. The method of example 10 wherein at least some of the gadolinium nanoparticles have a diameter less than 10 nanometers.

18. A device comprising:
a conductive base layer;
multiple conductive semiconductor layers supported by the base layer, the semiconductor layers have integrated gadolinium nanoparticles presenting a high cross section to neutron particles and wherein each semiconductor layer is separated by an intermediate conductive layer; and
a conductive top layer electrically coupled to the last of the multiple semiconductor layers, wherein the base layer, intermediate layers, and top layer are electrically coupled in parallel to generate current from electrons resulting from neutron collisions with the gadolinium nanoparticles.

19. The device of example 18 wherein at least some of the semiconductor layers have a thickness adapted to facilitate capture of the resulting electrons by the base and top layers.

20. The device of example 18 wherein the semiconductor layers comprises silicon.

A device comprising:
a layer of gadolinium-based phosphor disposed on an optical concentrator; and
a photodetector array of photodetector elements, where each photodetector element is mated to an individual optical concentrator.

Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The invention claimed is:

1. A device comprising:
a conductive base layer;
a conductive semiconductor layer supported by and electrically coupled to the base layer, the semiconductor layer having integrated gadolinium nanoparticles presenting a high cross section to neutron particles, wherein the nanoparticles are coated with a protective material configured to avoid the formation of a polycrystalline aggregate; and
a conductive top layer electrically coupled to the semiconductor, wherein the base layer and top layer are disposed to generate current from electrons resulting from neutron interactions with the gadolinium nanoparticles.

2. The device of claim 1 wherein the semiconductor layer has a thickness adapted to facilitate capture of the resulting electrons by the base and top layers, wherein the conductive base layer is metallic, wherein the conductive top layer is metallic, wherein the base layer is mechanically connected to a first side of the semiconductor layer and the top layer is mechanically connected to a second side of the semiconductor layer, and wherein the first side is opposite the second side.

3. The device of claim 2 wherein the thickness of the semiconductor layer is less than or equal to a path length of resulting electrons.

4. The device of claim 1 and further comprising gadolinium nanoparticles having a diameter less than 100 nanometers.

5. The device of claim 1 and further comprising gadolinium nanoparticles having a diameter less than 10 nanometers.

6. The device of claim 1 and further comprising gadolinium nanoparticles having a diameter of between approximately 100 nanometer and 10 nanometers.

7. The device of claim 1 wherein the semiconductor layer comprises silicon.

8. The device of claim 1 wherein the semiconductor layer comprises conductively doped silicon.

9. The device of claim 1 wherein the semiconductor layer comprises at least one of PbSe and PbS.

10. A method comprising:
forming a conductive base layer;
printing a slurry including a semiconductor layer and having integrated gadolinium nanoparticles presenting a high cross section to neutron particles mixed into the slurry; and
forming a conductive top layer electrically coupled to the semiconductor layer, wherein the base layer and top layer are disposed to generate current from electrons resulting from neutron interactions with the gadolinium nanoparticles.

11. The method of claim 10 and further comprising moving the conductive base layer while adding the semiconductor layer and forming the conductive top layer in a roll-to-roll process.

12. The method of claim 10 wherein the slurry comprises a solvent to give the slurry a specified consistency.

13. The method of claim 10 wherein the semiconductor layer has a thickness adapted to facilitate capture of the resulting electrons by the base and top layers.

14. The method of claim 13 wherein the thickness of the semiconductor layer is less than or equal to a path length of resulting electrons.

15. The method of claim 10 wherein at least some of the gadolinium nanoparticles have a diameter less than 100 nanometers.

16. The method of claim 10 wherein at least some of the gadolinium nanoparticles have a diameter less than 10 nanometers.

17. The method of claim 10, further comprising coating the nanoparticles with a protective material configured to avoid the formation of a polycrystalline aggregate and wherein:
   forming the base layer includes forming a metallic base layer,
   printing the slurry includes printing the slurry on the base layer to mechanically connect and electrically couple the base layer to the slurry,
   curing the slurry, and
   forming the conductive top layer includes forming a metallic top layer on the cured slurry.

18. A device comprising:
   a conductive base layer;
   multiple conductive semiconductor layers supported by the base layer, the semiconductor layers having integrated gadolinium nanoparticles presenting a high cross section to neutron particles, wherein each semiconductor layer is separated by an intermediate conductive layer, and wherein the nanoparticles are coated with a protective material configured to avoid the formation of a polycrystalline aggregate; and
   a conductive top layer electrically coupled to a top semiconductor layer of the multiple semiconductor layers, wherein the base layer, intermediate layers, and top layer are electrically coupled in parallel to generate current from electrons resulting from neutron interactions with the gadolinium nanoparticles.

19. The device of claim 18 wherein at least some of the semiconductor layers have a thickness adapted to facilitate capture of the resulting electrons by the base and top layers, wherein the conductive base layer is metallic, wherein the conductive top layer is metallic, wherein the base layer is mechanically connected to a bottom semiconductor layer of semiconductor layers and the top layer is mechanically connected to the top semiconductor layer of the semiconductor layers, and wherein the top semiconductor layer is opposite the bottom semiconductor layer.

* * * * *